(12) United States Patent
Ryan et al.

(10) Patent No.: US 11,451,129 B1
(45) Date of Patent: Sep. 20, 2022

(54) GATE DRIVER CIRCUIT FOR A POWER SUPPLY VOLTAGE CONVERTER

(71) Applicant: AES Global Holdings PTE Ltd., Singapore (SG)

(72) Inventors: Robert Ryan, Cork (IE); Diarmuid Hogan, Youghal (IE)

(73) Assignee: AES Global Holdings PTE Ltd., Singapore (SG)

( * ) Notice: Subject to any disclaimer, the term of this patent is extended or adjusted under 35 U.S.C. 154(b) by 0 days.

(21) Appl. No.: 17/220,976

(22) Filed: Apr. 2, 2021

(51) Int. Cl.
*H02M 3/156* (2006.01)
*H02M 1/08* (2006.01)

(52) U.S. Cl.
CPC ............. *H02M 1/08* (2013.01); *H02M 3/156* (2013.01)

(58) Field of Classification Search
None
See application file for complete search history.

(56) References Cited

U.S. PATENT DOCUMENTS

| 8,098,055 B2* | 1/2012 | Avrutsky | H02J 1/102 363/67 |
| 11,018,592 B2* | 5/2021 | Ausseresse | H02M 3/3353 |
| 11,121,625 B2* | 9/2021 | Clark | H02M 3/073 |
| 2003/0016545 A1* | 1/2003 | Jutras | H02M 3/1588 363/18 |

FOREIGN PATENT DOCUMENTS

| CN | 108448886 B | 8/2020 |
| KR | 101137494 B1 | 4/2012 |

* cited by examiner

*Primary Examiner* — Jeffrey A Gblende

(57) ABSTRACT

A gate driver circuit comprises an auxiliary winding, a voltage summer, an auxiliary voltage bus, a gate driver integrated circuit (IC), and a controller. The auxiliary winding is positioned adjacently to the inductor and configured to inductively couple with the inductor. The voltage summer comprises a pair of diodes coupled to the auxiliary winding and a pair of capacitors coupled to the pair of diodes. The auxiliary voltage bus is configured to receive a summed voltage from the voltage summer based on a sum of voltages stored in the pair of capacitors. The gate driver IC is configured to receive a voltage from a positive rail of the auxiliary voltage bus and to output a gate control signal to control a switching device based on the received voltage and based on a pulse signal generated by the controller.

20 Claims, 3 Drawing Sheets

GATE DRIVER CIRCUIT FOR A POWER SUPPLY VOLTAGE CONVERTER

TECHNICAL FIELD

Aspects of the disclosure are related to power supplies and, in particular, to power supply gate drivers.

BACKGROUND

A power supply typically converts an incoming voltage into a different, output voltage. For example, an alternating current (AC) input voltage may be converted to a direct current (DC) voltage for use by electronic equipment. In another example, a first DC input voltage may be converted to a different DC voltage for use by the electronic equipment.

Power supply topologies can include stepping down power in the form of a buck converter. The buck converter may be used to provide a well-regulated output voltage or current from a poorly regulated input power source. The buck converter can find a use in many different power-electronics applications due to its simple and robust nature.

A known building block 100 in a synchronous arrangement is illustrated in FIG. 1. Synchronous buck converter 100 includes a high-side switch $Q_1$, a low-side synchronous rectifier switch $Q_2$, and a buck inductor $L_1$. The output voltage ($v_o$) and/or current are regulated by sensing the output voltage and/or current and inputting these signals to suitable control feedback and pulse-width-modulation (PWM) generation circuitry 102 in order to drive the gates of the switches $Q_1$, $Q_2$. Appropriate toggling of the high- and low-side switches $Q_1$, $Q_2$ on and off allows the buck inductor current $i_L$ to be controlled.

The synchronous buck converter 100 is a commonly adopted topology for low input voltages (e.g., $V_{bulk}$<100 V). The converter 100 can also exhibit low conduction loss and low switching loss with an appropriately selected low-side switch $Q_2$ such as a switch with a low voltage rating having a low on resistance. However, for higher input voltages (e.g., $V_{bulk}$>100 V), the switches $Q_1$, $Q_2$ must have higher voltage ratings. Higher-voltage rated switches generally exhibit a sharp increase in switching loss when used in the synchronous buck converter 100. Hence, it is not common to use the synchronous buck converter 100 in applications with higher input voltages (e.g., $V_{bulk}$>100 V).

Overview

In accordance with one aspect, a gate driver circuit is provided for a voltage converter having a voltage input, a voltage output, a switching device coupled to the voltage input, and an inductor coupled between the switching device and the voltage output. The gate driver circuit comprises an auxiliary winding, a voltage summer, an auxiliary voltage bus, a gate driver integrated circuit (IC), and a controller. The auxiliary winding is positioned adjacently to the inductor and configured to inductively couple with the inductor. The voltage summer comprises a pair of diodes coupled to the auxiliary winding and a pair of capacitors coupled to the pair of diodes. The auxiliary voltage bus is coupled in parallel with the voltage summer and is configured to receive a summed voltage from the voltage summer based on a sum of voltages stored in the pair of capacitors. The gate driver IC is coupled to the auxiliary voltage bus and comprises a logic input configured to receive a pulse signal, an output stage supply input configured to receive a voltage from a positive rail of the auxiliary voltage bus, and a drive output configured to output a gate control signal based on the voltage received from the positive rail and based on the pulse signal received at the logic input. The controller is configured to generate the pulse signal and supply the pulse signal to the logic input.

In accordance with another aspect, a voltage converter comprises a voltage input configured to receive a bulk voltage, a voltage output configured to provide an output voltage to a load, and a controlled switching device coupled to the voltage input. The voltage converter also comprises a transformer, a voltage summer, an auxiliary voltage bus, a gate driver integrated circuit (IC), and a controller. The transformer comprises a primary winding coupled between the controlled switching device and the voltage output and comprises a secondary winding inductively coupled with the primary winding. The voltage summer comprises first and second diodes coupled to the secondary winding and comprises first and second capacitors coupled to the first and second diodes. The auxiliary voltage bus is coupled in parallel with the voltage summer and configured to receive a summed voltage from the voltage summer based on a sum of voltages stored in the first and second capacitors. The gate driver IC is coupled to the auxiliary voltage bus and configured to control a conducting state of the controlled switching device based on a voltage from a positive rail of the auxiliary voltage bus and based on a pulse signal received by a logic input. The controller is configured to generate the pulse signal and supply the pulse signal to the logic input.

BRIEF DESCRIPTION OF THE DRAWINGS

The drawings illustrate embodiments presently contemplated for carrying out embodiments of the present disclosure.

In the drawings.

Figure 1:
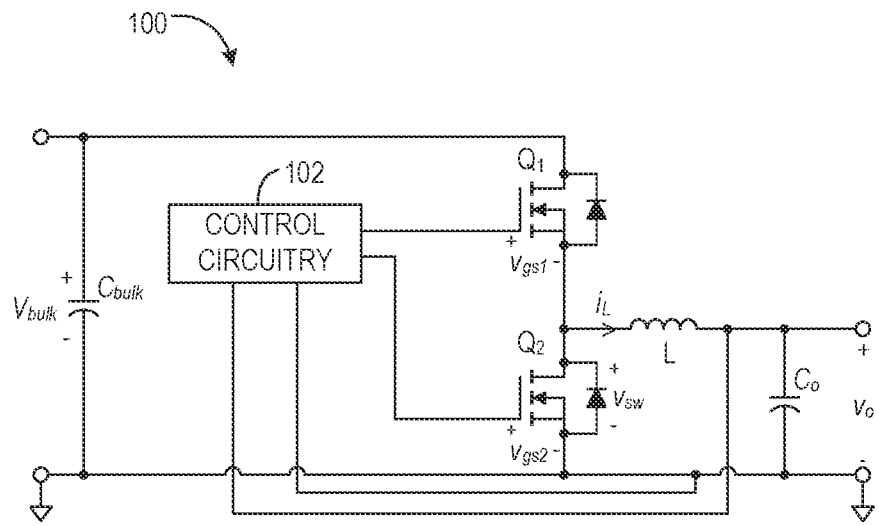
FIG. 1 illustrates a schematic block diagram of a synchronous buck converter circuit.

While the present disclosure is susceptible to various modifications and alternative forms, specific embodiments thereof have been shown by way of example in the drawings and are herein described in detail. It should be understood, however, that the description herein of specific embodiments is not intended to limit the present disclosure to the particular forms disclosed, but on the contrary, the intention is to cover all modifications, equivalents, and alternatives falling within the spirit and scope of the present disclosure. Note that corresponding reference numerals indicate corresponding parts throughout the several views of the drawings.

DETAILED DESCRIPTION

Examples of the present disclosure will now be described more fully with reference to the accompanying drawings. The following description is merely exemplary in nature and is not intended to limit the present disclosure, application, or uses.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Although the disclosure hereof is detailed and exact to enable those skilled in the art to practice the invention, the physical embodiments herein disclosed merely exemplify the invention which may be embodied in other specific structures. While the preferred embodiment has been described, the details may be changed without departing from the invention, which is defined by the claims.

Figure 2:
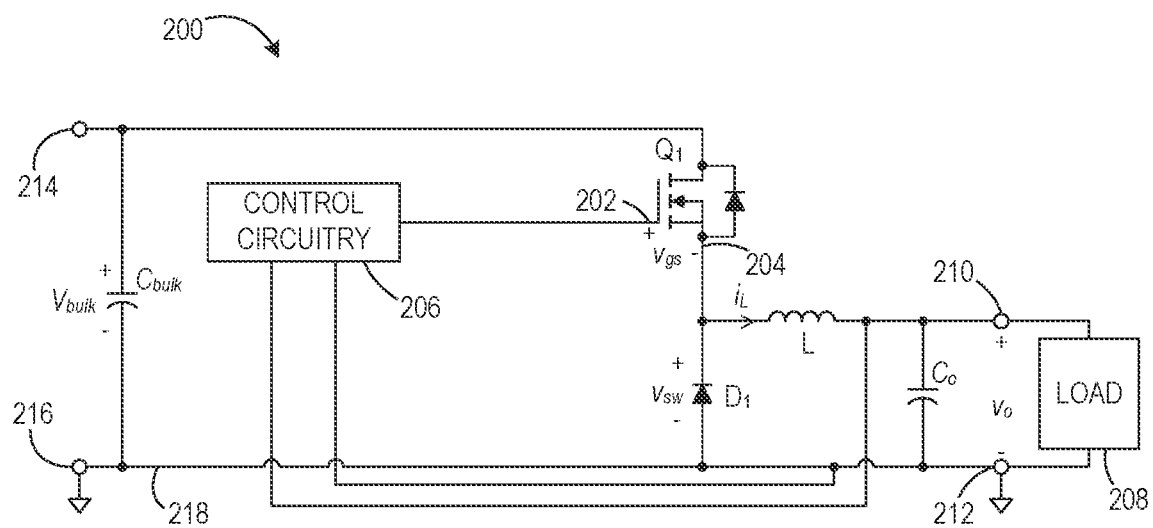
FIG. 2 illustrates a schematic block diagram of a non-synchronous buck converter circuit according to an embodiment.

FIG. 2 illustrates a schematic block diagram of a non-synchronous buck converter circuit 200 according to an embodiment. Compared with the synchronous buck converter 100 when higher voltage rated components are used in response to higher input voltages that exceed a certain threshold (e.g., $V_{bulk}$>100 V), the use of higher voltage rated components in the non-synchronous buck converter circuit 200 provides an improvement in switching and reverse-recovery related losses.

As illustrated, the non-synchronous buck converter circuit 200 includes a high-side switch $Q_1$, a buck inductor $L_1$, and a buck diode $D_1$, which replaces the controlled low-side switch $Q_2$ of the synchronous buck converter 100 in FIG. 1 with a non-controlled switching device. The high-side switch $Q_1$ is a controlled switch and has a gate terminal 202 and a source terminal 204. Control of the high-side switch $Q_1$ into a conducting or on state and control of the switch $Q_1$ into a non-conducting or off state is accomplished with a control circuitry block 206. By appropriately driving the high-side switch $Q_1$ with the control circuitry block 206, a desired output voltage may be provided to a load 208 via a pair of output terminals 210, 212. The desired output voltage is less than the voltage input provided to the circuit 200 via a pair of input terminals 214, 216 in the buck converter arrangement illustrated in FIG. 2.

As switch $Q_1$ is a high-side switch, the source terminal 204 is referenced to the switch-node voltage $v_{sw}$, which is across the buck diode $D_1$, and is not referenced to the signal ground 218. A bootstrap circuit, often used to control the high-side switch $Q_1$, can fail or provide less-than-optimal control in scenarios including light load or low power operation and in battery/capacitor charging loads. At light loads, the bootstrap circuit can fail to adequately charge its capacitor ($C_b$, not shown) when the average current flowing through buck diode $D_1$ falls below the average bootstrap current. In the case where an output voltage is already present on the converter before start-up (e.g., a battery/capacitor charging load), the bootstrap diode ($D_b$, not shown) is always reversed biased, and the bootstrap circuit cannot start up.

Figure 3:
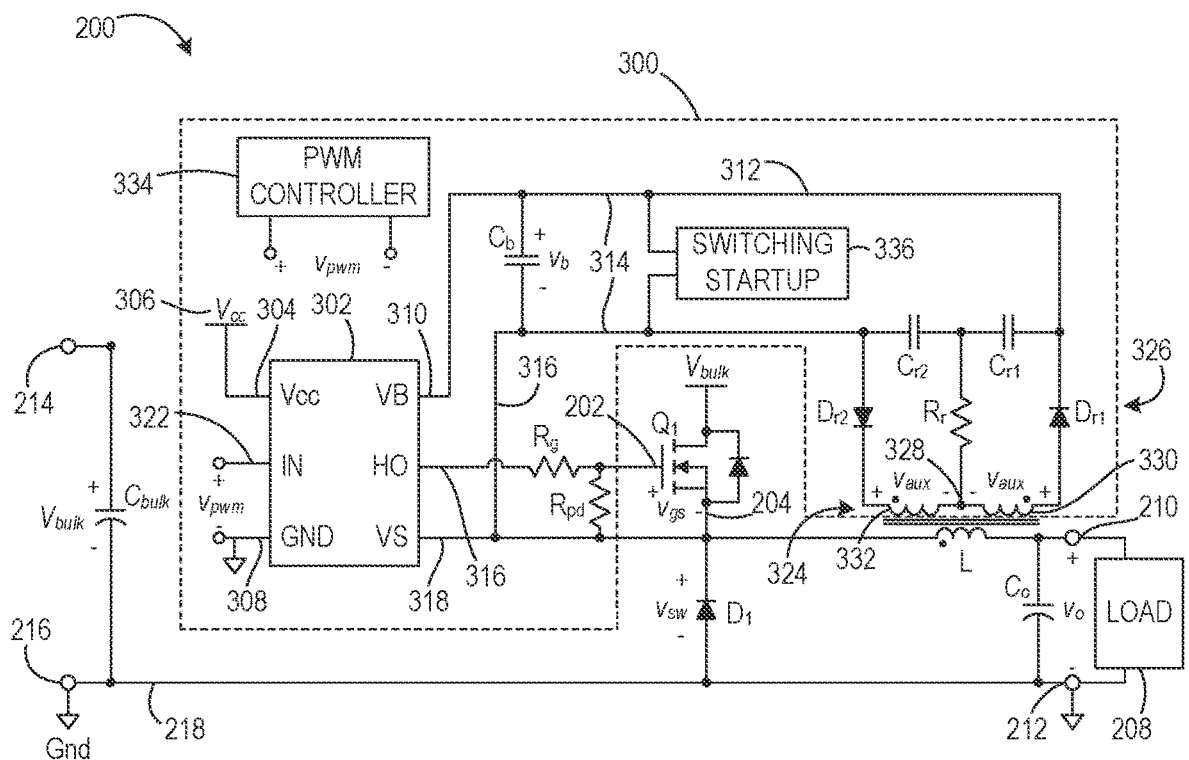
FIG. 3 illustrates a gate driver circuit according to another embodiment.

FIG. 3 illustrates an example of the non-synchronous buck converter circuit 200 of FIG. 2 incorporating a novel high-side gate-drive circuit 300 capable of driving the high-side switch $Q_1$ of FIG. 2 according to an embodiment. Gate-drive circuit 300 includes a high-side gate driver integrated circuit (IC) 302 such as one commonly available in the marketplace. Gate driver IC 302 includes a VCC input 304 ("VCC") configured to receive a supply voltage such as a Vcc voltage 306 from a voltage source (not shown) and includes a ground input 308 ("GND") coupleable to a voltage source ground. An output stage supply input 310 ("VB") is configured to receive an output stage supply voltage on a positive rail 312 of an auxiliary voltage bus 314 that, when provided by a high-side drive output 316 ("HO"), drives the high-side switch $Q_1$. A high-side floating offset output 318 ("VS") is coupled to a negative auxiliary voltage bus 320 of the auxiliary voltage bus 314 and is coupled to the source terminal 204 of the high-side switch $Q_1$ to provide a reference for the $v_{gs}$ voltage across the gate and source terminals 202, 204. The gate driver IC 302 also includes a logic input 322 ("IN") that drives the supply of the output stage supply voltage from the output stage supply input 310 to the high-side drive output 316. That is, in response to a logic high $V_{pwm}$ signal into the logic input 322, the output stage supply input 310 substantially passes through to the high-side drive output 316. In response to a logic low $v_{pwm}$ signal into the logic input 322, the high-side drive output 316 is substantially cut off from the output stage supply input 310. The HO output 316 is coupled to the gate terminal 202 of the high-side switch $Q_1$ through a current-limiting resistor $R_g$. The gate terminal 202 of the high-side switch $Q_1$ is coupled to the source terminal 204 through a pull-down resistor 204, which guarantees that the gate terminal 202 is always pulled to ground when no PWM is applied.

Since the source terminal 204 is referenced to the switch-node voltage $v_{sw}$ rather than to the signal ground 218, successfully driving the high-side switch $Q_1$ into its on and off states is based on the generation of the supply voltage provided to the output stage supply input 310 that is also referenced to the switch-node voltage $v_{sw}$ rather than to the signal ground 218. The gate-drive circuit 300 generates a supply voltage referenced to the switch-node voltage $v_{sw}$ via an auxiliary winding 324 coupled in parallel to a voltage summer 326 that is coupled across the output stage supply input 310 and the high-side floating offset output 318. Additionally, the voltage summer 326 is coupled in parallel with a capacitor $C_b$.

The auxiliary winding 324 includes a center-tapped connection 328 that splits the auxiliary winding 324 into a first auxiliary winding 330 and a second auxiliary winding 332. The auxiliary winding 324 is inductively coupled to the buck inductor L, and each first and second auxiliary windings 330, 332 has a winding ratio of 1:n, where 1 is the number of turns of the buck inductor L and n is the number of turns of the respective first and second auxiliary winding 330, 332. For example, if the buck inductor L has 100 turns and each of the first and second auxiliary windings 330, 332 has 6 turns, then the ratio of each first and second auxiliary winding 330, 332 is 100:6:6. In one embodiment, a transformer houses the buck inductor L as a primary winding and the auxiliary winding 324 as a secondary winding.

The voltage summer 326 includes a first diode $D_{r1}$ having its anode coupled to the first auxiliary winding 330 and having its cathode coupled to a first connection of a first capacitor $C_{r1}$. A second diode $D_{r2}$ has its anode coupled to the second auxiliary winding 332 and has its cathode coupled to a first connection of a second capacitor $C_{r2}$. A current limiting resistor $R_r$ is shown coupled between the center-tapped connection 328 and the second connections of the first and second capacitors $C_{r1}$, $C_{r2}$. While shown in FIG. 3, current limiting resistor $R_r$ is optional and can be removed. In this case, the center-tapped connection 328 would be directly coupled to the second connections of the first and second capacitors $C_{r1}$, $C_{r2}$. As used herein, a voltage summer is a type of voltage multiplier where the total voltage across multiple separately charged capacitors yields a total voltage. In a common type of voltage multiplier, a same or similar charge voltage is used to charge each capacitor of the voltage multiplier, resulting in the multiplication of the charge voltage by the number of capacitors. As described herein, however, the capacitors $C_{r1}$, $C_{r2}$ of the voltage summer 326 are not charged through the operation of the non-synchronous buck converter circuit 200 by the same or similar voltage value. The combined output of the capacitors $C_{r1}$, $C_{r2}$ is summed to provide the voltage $v_b$ for use in the circuit 200 as described. Although the voltage summer 326 does not function in the non-synchronous buck converter circuit 200 as a voltage doubler due to the mismatched charge voltages experienced in the arrangement of the circuit 200, the voltage summer 326 would act as a voltage doubler if both capacitors $C_{r1}$, $C_{r2}$ were charged with the same charge voltages.

Figure 4:
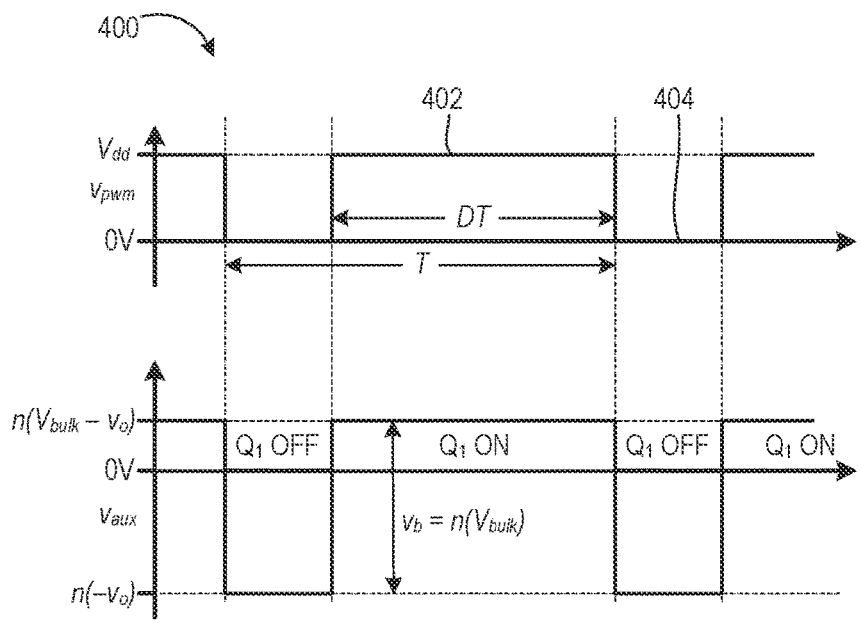
FIG. 4 illustrates waveforms of a control scheme according to an embodiment.

FIG. 4 illustrates waveforms of a control scheme 400 according to an embodiment. Referring to FIGS. 3 and 4, operation of the gate-drive circuit 300 as a high-side switch driver includes a PWM signal, $v_{pwm}$, provided by one or more PWM generators or controllers (e.g., a microcontroller) such as PWM controller 334. In one embodiment, the PWM signal is a digital PWM (DPWM) signal where a voltage of \Tad yields a logic high signal 402 and a voltage of 0 V yields a logic low signal 404. In other embodiments, the PWM signal may be an analog signal.

In the switching operation of the control scheme 400 where the high-side switch $Q_1$ is transitioned into its on and off states, the logic high signal 402 from the $v_{pwm}$ signal yields an on state transition of the high-side switch $Q_1$ that supplies the bulk voltage $V_{bulk}$ to the buck inductor L such that the voltage across the buck inductor L equals $V_{bulk}-v_o$. Consequently, the voltage induced in each of the first and second auxiliary windings 330, 332 is $n(V_{bulk}-v_o)$. In the first auxiliary winding 330, the voltage $n(V_{bulk}-v_o)$ causes the first diode $D_{r1}$ into a conducting state, and the first capacitor $C_{r1}$ is charged across its first and second connections toward a voltage approaching the voltage $n(V_{bulk}-v_o)$. In the second auxiliary winding 332, the voltage $n(V_{bulk}-v_o)$ causes the second diode $D_{r2}$ into a non-conducting state; thus, the voltage $n(V_{bulk}-v_o)$ is not used to charge the second capacitor $C_{r2}$.

The logic low signal 404 from the $v_{pwm}$ signal yields an off state transition of the high-side switch $Q_1$, causing the voltage across the buck inductor L to reverse and causing the voltage $n(-v_o)$ to be generated across the buck inductor L. The voltage $n(-v_o)$ in the first auxiliary winding 330 causes the first diode $D_{r1}$ to enter a non-conducting state, and the first capacitor $C_{r1}$ is not charged based on the voltage $n(-v_o)$. However, in the second auxiliary winding 332, the voltage $n(-v_o)$ causes the second diode $D_{r2}$ to conduct and charge the second capacitor $C_{r2}$ across its first and second connections toward a voltage approaching the voltage $n(-v_o)$.

In response to controlling the high-side switch $Q_1$ into its on and off transition states, the first and second capacitors $C_{r1}$, $C_{r2}$ are thus respectively charged to the voltages $n(V_{bulk}-v_o)$ and $n(-v_o)$. Due in part to at least the arrangements of the windings of the first and second auxiliary windings 330, 332 and the arrangements of the first and second diodes $D_{r1}$, $D_{r2}$, the negative voltage $n(-v_o)$ with respect to the first and second connections of the second capacitor $C_{r2}$ and the positive voltage $n(V_{bulk}-v_o)$ with respect to the first and second connections of the second capacitor $C_{r2}$, the voltage $v_b$ across the capacitor $C_b$ is the sum of $n(V_{bulk}-v_o)-n(-v_o)$, which yields the voltage $n(V_{bulk})$ (as illustrated in FIG. 4) across the capacitor $C_b$ and presented to the output stage supply input 310.

The switching operation described above takes advantage of the voltage generated across the auxiliary winding 324 to generate the voltage $v_b$ that provides the voltage/current from the high-side drive output 316 to drive the gate terminal 202 of the high-side switch $Q_1$. Accordingly, generation of the voltage $v_b$ is based on the voltage generated across the auxiliary winding 324 while the voltage $v_b$ is used to transition the high-side switch $Q_1$ between its on and off states to generate the voltage across the buck inductor L. Therefore, without the voltage $v_b$, the high-side switch $Q_1$ cannot be switched on and off, which in turn causes no voltage transitions across the buck inductor L to generate the voltage $v_b$. Thus, one or other of the voltage $v_b$ and the voltage across the buck inductor L can be helped by an additional voltage source in order to provide the voltage to start the voltage generation cycle.

According to one embodiment, the gate-drive circuit 300 includes a switching start-up block 336 having a first output terminal 338 and a second output terminal 340 coupled in parallel with the capacitor $C_b$ that is used to provide an initial voltage to the output stage supply input 310 sufficient to begin controlling the high-side switch $Q_1$ between its on and off states. Once the switch begins to transition between its on and off states, a voltage is generated across the auxiliary winding 324, which then supplies the output stage supply input 310.

Figure 5:
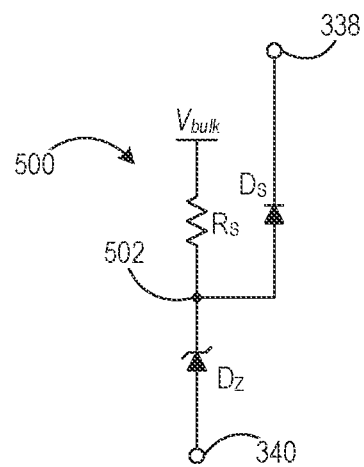
FIG. 5 illustrates a switching start-up circuit according to an embodiment.

FIG. 5 illustrates a switching start-up circuit 500 usable in the switching start-up block 336 according to an embodiment. A resistor $R_S$ has a first terminal coupled to receive the voltage $V_{bulk}$ received on the input terminal 214 of the non-synchronous buck converter circuit 200. A second terminal of the resistor $R_S$ is coupled to a node 502 coupling the cathode of a Zener diode $D_Z$ to the anode of a diode Ds. The cathode of the diode Ds is coupled to the first output terminal 338, which is connected to the positive rail 312 of the auxiliary voltage bus 314, and the anode of the Zener diode $D_Z$ is coupled to the second output terminal 340, which is coupled to the negative rail 320 of the auxiliary voltage bus 314. As stated above, embodiments described herein can be used in response to higher input voltages (e.g., $V_{bulk}$) that exceed a certain threshold (e.g., $V_{bulk}$>100 V). Accordingly, the voltage drop across the resistor $R_S$ together with the voltage of the Zener diode $D_Z$ less the voltage drop across the diode Ds is provided to the positive rail 312 of the auxiliary voltage bus 314. While the components of the auxiliary winding 324 and the voltage summer 326 may be sized to provide a target current (e.g., 10 mA) to the gate driver IC 302 for gate control of the high-side switch $Q_1$, they are subject to much lower voltages due to the turns ratio identified above. In contrast, the supply of the same level of current through the resistor $R_S$ together with the voltage across the resistor $R_S$ due to the voltage step-down from $V_{bulk}$ to $v_b$ is likely to damage the resistor $R_S$. However, reducing the level of current through the resistor $R_S$ to a value such as 0.5 mA can be sufficient in the initial start-up of the gate-drive circuit 300 sufficient to start the switching that generates the voltage $v_b$ from the buck inductor L. After switching has started generating the voltage $v_b$, the current provided by the switching start-up circuit 500 does not need to be relied on to maintain the voltage $v_b$ generation. However, while the switching start-up circuit 500 will continue to provide such current to the auxiliary voltage bus 314, the lower current is much less detrimental to the life and operation of the resistor $R_S$.

Figure 6:
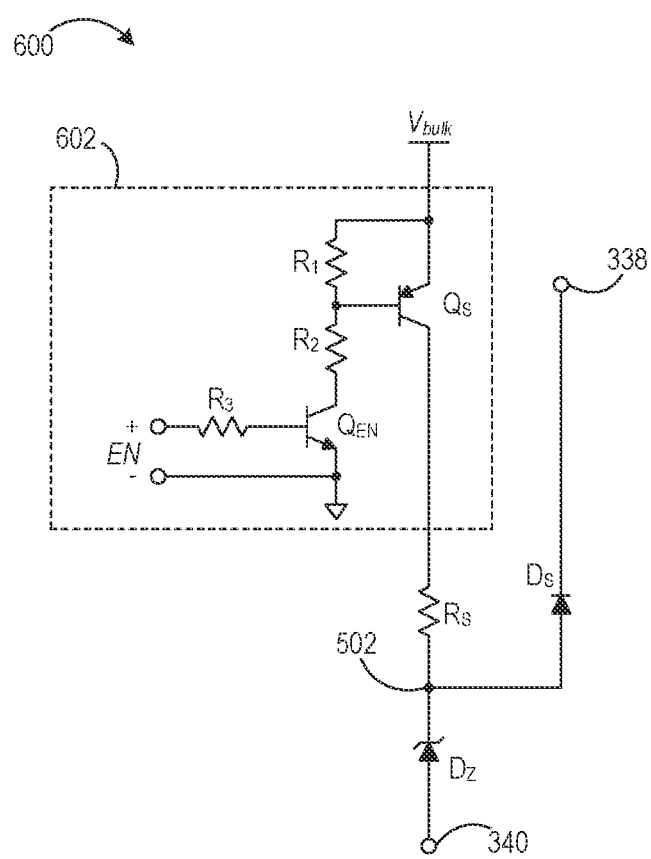
FIG. 6 illustrates a switching start-up circuit according to another embodiment.

One effect of adding the switching start-up circuit 500 to the gate-drive circuit 300 can include the input bulk voltage $V_{bulk}$ pulling the output voltage $v_o$ up through the resistor $R_S$ in the case where the converter 200 is disabled (e.g., $v_{pwm}$ is off). For example, the resistor $R_S$ may form a resistive potential divider circuit with a voltage sense network (not shown) across the output of the converter 200. In this case, an output voltage $v_o$ of 50% or more of the bulk voltage $V_{bulk}$ may exist even when the non-synchronous buck converter circuit 200 is off. FIG. 6 illustrates a switching start-up circuit 600 according to another embodiment that addresses the voltage pull-up effect.

The switching start-up circuit 600 includes an enable circuit 602 positioned between the resistor $R_S$ and the input bulk voltage $V_{bulk}$. The enable circuit 602 has a switch $Q_S$ serially coupled between the resistor $R_S$ and the input bulk voltage $V_{bulk}$. In one embodiment, the switch $Q_S$ is a p-type transistor. Controlling the on and off states of the switch $Q_S$ is a control network including serially connected resistors $R_1$ and $R_2$ coupled to a control terminal (e.g., base terminal) of the switch $Q_S$. Resistor $R_1$ is also connected to the input bulk voltage $V_{bulk}$, while the resistor $R_2$ is further connected to a second switch $Q_{EN}$ controlled by a resistor $R_3$ coupled to an enable ("EN") input, which receives an enable control signal indicating whether the switch $Q_S$ should be on or off. When the enable input indicates that the switch $Q_S$ should be on (e.g., a logic high signal), switch $Q_{EN}$ conducts, causing the voltage divider provided by the resistors $R_1$ and $R_2$ to turn on the switch $Q_S$. In this manner, the switching start-up circuit 600 is operated to provide the initial voltage $v_b$ for start-up of the gate-drive circuit 300. When the enable input indicates that the switch $Q_S$ should be off (e.g., a logic low signal), switch $Q_{EN}$ stops conducting, causing the voltage divider provided by the resistors $R_1$ and $R_2$ to turn the switch $Q_S$ off. In this manner, the resistor $R_S$ is disconnected from the input bulk voltage $V_{bulk}$ and does not provide voltage or current to the auxiliary voltage bus 314.

Embodiments of the disclosure provide an auxiliary winding buck-converter high-side gate driver to create a floating supply, which powers the bias voltage of a high-side gate drive IC. The embodiments provide improved voltage conversion solutions for both battery-capacitor charging operations and low-power operations. For example, such embodiments offer a minimization of performance conditions at light-load operation, are suitable for battery charging applications, and do not pull up the output voltage when the converter is disabled.

While the invention has been described in detail in connection with only a limited number of embodiments, it should be readily understood that the invention is not limited to such disclosed embodiments. Rather, the invention can be modified to incorporate any number of variations, alterations, substitutions, or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the invention is not to be seen as limited by the foregoing description but is only limited by the scope of the appended claims.

What is claimed is:

1. A gate driver circuit for a voltage converter having a voltage input, a voltage output, a switching device coupled to the voltage input, and an inductor coupled between the switching device and the voltage output, the gate driver circuit comprising:
   an auxiliary winding positioned adjacently to the inductor and configured to inductively couple with the inductor;
   a voltage summer comprising:
      a pair of diodes coupled to the auxiliary winding; and
      a pair of capacitors coupled to the pair of diodes;
   an auxiliary voltage bus coupled in parallel with the voltage summer and configured to receive a summed voltage from the voltage summer based on a sum of voltages stored in the pair of capacitors;
   a gate driver integrated circuit (IC) coupled to the auxiliary voltage bus, the gate driver IC comprising:
      a logic input configured to receive a pulse signal;
      an output stage supply input configured to receive a voltage from a positive rail of the auxiliary voltage bus; and
      a drive output configured to output a gate control signal based on the voltage received from the positive rail and based on the pulse signal received at the logic input; and
   a controller configured to:
      generate the pulse signal; and
      supply the pulse signal to the logic input.

2. The gate driver circuit of claim 1, wherein the auxiliary winding comprises a tapped winding.

3. The gate driver circuit of claim 2, wherein the tapped winding is a center-tapped winding.

4. The gate driver circuit of claim 2, wherein a first auxiliary winding is formed between a first end of the auxiliary winding and the tapped winding; and
   wherein a second auxiliary winding is formed between a second end of the auxiliary winding and the tapped winding.

5. The gate driver circuit of claim 4, wherein:
   the pair of diodes comprises a first diode and a second diode;
   the pair of capacitors comprises a first capacitor and a second capacitor;
   the first diode is coupled between the first end of the first auxiliary winding and a first terminal of the first capacitor;
   the second diode is coupled between the second end of the first auxiliary winding and a first terminal of the second capacitor; and
   a second terminal of the first capacitor and a second terminal of the second capacitor are coupled together and to the tapped winding.

6. The gate driver circuit of claim 5, wherein:
   the first and second auxiliary windings, are configured to:
      generate a first auxiliary voltage in response to a first inductor voltage generated in the inductor; and
      generate a second auxiliary voltage in response to a second inductor voltage generated in the inductor;
   the first capacitor is configured to store a first charge voltage in response to the first auxiliary voltage being generated in the first auxiliary winding; and
   the second capacitor is configured to store a second charge voltage in response to the second auxiliary voltage being generated in the second auxiliary winding.

7. The gate driver circuit of claim 1, wherein the gate driver circuit further comprises a switching startup circuit coupled to the auxiliary voltage bus and configured to provide a startup voltage to the auxiliary voltage bus prior to the auxiliary voltage bus receiving the summed voltage.

8. The gate driver circuit of claim 7, wherein the switching startup circuit comprises:
   a first terminal coupled to the positive rail of the auxiliary voltage bus;

a second terminal coupled to a negative rail of the auxiliary voltage bus;
a first diode coupled to the first terminal;
a second diode coupled to the first diode at a first node and coupled to the second terminal; and
a resistor coupled to the first node and configured to receive a voltage based on an input voltage received by the voltage input.

9. The gate driver circuit of claim 8, wherein the switching start-up circuit further comprises an enable circuit coupled between the resistor and the voltage input.

10. The gate driver circuit of claim 9, wherein the enable circuit comprises:
a switching device coupled between the resistor and the voltage input; and
a control network coupled to the switching device and configured to control switching of the switching device into conducting and non-conducting states, the control network comprising:
a resistor divider coupled to a control terminal of the switching device;
a switching device coupled to the resistor divider; and
an enable input configured to receive a signal for controlling the switching device into an on state or into an off state.

11. The gate driver circuit of claim 8, wherein the second diode comprises a Zener diode.

12. A voltage converter comprising:
a voltage input configured to receive a bulk voltage;
a voltage output configured to provide an output voltage to a load;
a controlled switching device coupled to the voltage input;
a transformer comprising:
a primary winding coupled between the controlled switching device and the voltage output; and
a secondary winding inductively coupled with the primary winding;
a voltage summer comprising:
first and second diodes coupled to the secondary winding; and
first and second capacitors coupled to the first and second diodes;
an auxiliary voltage bus coupled in parallel with the voltage summer and configured to receive a summed voltage from the voltage summer based on a sum of voltages stored in the first and second capacitors;
a gate driver integrated circuit (IC) coupled to the auxiliary voltage bus and configured to control a conducting state of the controlled switching device based on a voltage from a positive rail of the auxiliary voltage bus and based on a pulse signal received by a logic input; and
a controller configured to:
generate the pulse signal; and
supply the pulse signal to the logic input.

13. The voltage converter of claim 12, wherein the secondary winding comprises a center-tapped winding;
wherein a first auxiliary winding is formed between a first end of the secondary winding and the center-tapped winding; and
wherein a second auxiliary winding is formed between a second end of the secondary winding and the center-tapped winding.

14. The voltage converter of claim 13, wherein:
the first diode is coupled between the first end of the first auxiliary winding and a first terminal of the first capacitor;
the second diode is coupled between the second end of the first auxiliary winding and a first terminal of the second capacitor; and
a second terminal of the first capacitor and a second terminal of the second capacitor are coupled together and to the center-tapped winding.

15. The voltage converter of claim 14, wherein:
the first and second auxiliary windings, are configured to:
generate a first auxiliary voltage in response to a first inductor voltage generated in the primary winding; and
generate a second auxiliary voltage in response to a second inductor voltage generated in the primary winding;
the first capacitor is configured to store a first charge voltage in response to the first auxiliary voltage being generated in the first auxiliary winding; and
the second capacitor is configured to store a second charge voltage in response to the second auxiliary voltage being generated in the second auxiliary winding.

16. The voltage converter of claim 12, wherein the gate driver circuit further comprises a switching startup circuit coupled to the auxiliary voltage bus and configured to provide a startup voltage to the auxiliary voltage bus prior to the auxiliary voltage bus receiving the summed voltage.

17. The voltage converter of claim 16, wherein the switching startup circuit comprises:
a first terminal coupled to the positive rail of the auxiliary voltage bus;
a second terminal coupled to a negative rail of the auxiliary voltage bus;
a first diode coupled to the first terminal;
a second diode coupled to the first diode at a first node and coupled to the second terminal; and
a resistor coupled to the first node and configured to receive a voltage based on an input voltage received by the voltage input.

18. The voltage converter of claim 17, wherein the switching start-up circuit further comprises an enable circuit coupled between the resistor and the voltage input, the enable circuit comprising:
a switching device coupled between the resistor and the voltage input; and
a control network coupled to the switching device and configured to control switching of the switching device into conducting and non-conducting states, the control network comprising:
a resistor divider coupled to a control terminal of the switching device;
a switching device coupled to the resistor divider; and
an enable input configured to receive a signal for controlling the switching device into an on state or into an off state.

19. The voltage converter of claim 17, wherein the voltage converter comprises a non-synchronous buck converter.

20. The voltage converter of claim 17, wherein the bulk voltage is greater than 100 V.

* * * * *